United States Patent
Talwar et al.

(10) Patent No.: US 6,645,838 B1
(45) Date of Patent: Nov. 11, 2003

(54) SELECTIVE ABSORPTION PROCESS FOR FORMING AN ACTIVATED DOPED REGION IN A SEMICONDUCTOR

(75) Inventors: Somit Talwar, Palo Alto, CA (US); Yun Wang, San Jose, CA (US); Michael O. Thompson, Ithaca, NY (US)

(73) Assignee: Ultratech Stepper, Inc., San Jose, CA (US)

( * ) Notice: Subject to any disclaimer, the term of this patent is extended or adjusted under 35 U.S.C. 154(b) by 19 days.

(21) Appl. No.: 10/122,955

(22) Filed: Apr. 11, 2002

Related U.S. Application Data

(63) Continuation of application No. 09/546,115, filed on Apr. 10, 2000, now abandoned.

(51) Int. Cl.[7] .................. H01L 21/425; H01L 21/26; H01L 21/42; H01L 21/265
(52) U.S. Cl. .................. 438/530; 438/520; 438/529; 438/535
(58) Field of Search .................. 438/528, 530, 438/486, 529, 535, 540, 520, 550

(56) References Cited

U.S. PATENT DOCUMENTS

| | | | |
|---|---|---|---|
| 4,151,008 A | 4/1979 | Kirkpatrick | 148/1.5 |
| 4,456,490 A | 6/1984 | Dutta et al. | 148/1.5 |
| 4,617,066 A | 10/1986 | Vasudev | 148/1.5 |
| 5,756,369 A | 5/1998 | Aronowitz et al. | 438/16 |
| 5,897,381 A | 4/1999 | Aronowitz et al. | 438/798 |
| 5,908,307 A | 6/1999 | Talwar et al. | 438/199 |
| 5,956,603 A | * 9/1999 | Talwar et al. | 438/520 |
| 6,380,044 B1 | * 4/2002 | Talwar et al. | 438/308 |

\* cited by examiner

*Primary Examiner*—Erik Kielin
(74) *Attorney, Agent, or Firm*—Allston L. Jones

(57) ABSTRACT

A process for activating a doped region (80) or amorphized doped region (34) in a semiconductor substrate (10). The process includes the steps of doping a region of the semiconductor substrate, wherein the region is crystalline or previously amorphized. The next step is forming a conformal layer (40) atop the upper surface (11) of the substrate. The next step is performing at least one of front-side and backside irradiation of the substrate to activate the doped region. The activation may be achieved by heating the doped region to just below the melting point of the doped region, or by melting the doped region but not the crystalline substrate. An alternative process includes the additional step of forming the doped region (amorphized or unamorphized) within or adjacent a deep dopant region (60) and providing sufficient heat to the deep dopant region through at least one of front-side and backside irradiation so that the doped region is activated through explosive recrystallization.

12 Claims, 3 Drawing Sheets

SELECTIVE ABSORPTION PROCESS FOR FORMING AN ACTIVATED DOPED REGION IN A SEMICONDUCTOR

This is a continuation of application(s), Ser. No. 09/546,115, filed on Apr. 10, 2000 now abandoned.

FIELD OF THE INVENTION

The present invention relates to semiconductor processing, and more particularly relates to a process of forming an activated doped region in a semiconductor.

BACKGROUND OF THE INVENTION

Improvements in semiconductor technology and semiconductor manufacturing are the main drivers to the reduction of cost and the increase in speed of computers. There have been many improvements to semiconductor devices to increase their speed and performance, ranging from packaging of integrated circuits ("chips") to the wiring of the devices on the chip, to the design of the devices themselves.

Improvements in chip performance are generally obtained by changing the physical structure of the devices comprising the chip by inventing a new process (or improving an existing process) for making the devices. For example, with the continuing need for smaller integration densities and faster operational speeds, dopant impurity profiles for integrated devices are becoming increasingly shallower with greater dopant concentrations, as compared to previous generations of integrated devices. The shallower dopant profiles and greater dopant concentrations are used to decrease the sheet resistance of the source and drain regions to obtain faster transient response or logic-state switching rates relative to previous chips.

Thermal annealing techniques, such as rapid thermal annealing (RTA) or rapid thermal process (RTP), are becoming less attractive as options for performing activation annealing of doped regions of an integrated device after dopant implantation. This is mainly because thermal annealing techniques typically require heating the entire substrate to a maximum temperature for a time sufficient to activate the integrated device's source and drain regions, after which the substrate is permitted to cool to quench the doped source and drain regions. This approach is problematic because the substrate is capable of holding a relatively large amount of thermal energy, which requires significant time to be dissipated via radiation and convection before the dopant ions become incapable of moving due to solidification of the doped regions. Therefore, during the time required for the substrate to cool, the dopant ions can readily move beyond the intended boundaries of the doped regions (a phenomenon which is sometimes referred to as "transient enhanced diffusion"). As a result, the junction depth of the source/drain regions becomes greater than desired. This, in turn, leads to increased off-state leakage currents and thus reduced device performance.

The speed of semiconductor devices has also been limited to date by physical constraints on the amount of activated dopant concentrations. More specifically, for any two species of dopant and substrate ions, under equilibrium conditions, there are only a certain number of dopant ions that can be positioned at activated sites within the crystalline lattice of substrate ions. This limit is known as the 'solid solubility limit'. It is generally not possible in the fabrication of semiconductor devices to attain activated dopant concentrations above the solid solubility limit. With thermal annealing techniques, the minimum-sheet resistance attainable in the doped regions is controlled by the solid solubility limit, which is $3 \times 10^{20}$ ions/cm$^3$ for boron, $2 \times 10^{21}$ ions/cm$^3$ for arsenic, and $1.5 \times 10^{21}$ ions/cm$^3$ for phosphorous. Lower sheet resistance in the doped regions. of an integrated device generally leads to faster transient response or logic-state switching rates. Accordingly, it would be desirable to increase the dopant concentration in active sites within an integrated device's doped region(s) to levels above the solid solubility limit. Such dopant concentrations are not presently. attainable with known conventional annealing techniques.

The nature of the dopant profiles and the carrier concentration affect the performance of the chip. A gradual dopant profile is prone to leakage, while a reduced carrier (dopant) concentration can result in a higher sheet resistance than is desired. The formation of abrupt junctions (e.g., sharp dopant profiles) reduces overlap capacitance and spreading resistance, and the ability to increase the dopant concentration lowers the sheet resistance. Both these effects serve to increase the speed and improve the performance of the chip.

There are many prior art semiconductor processes pertaining to improving the performance of a semiconductor device by changing the properties of the device. For example, U.S. Pat. No. 5,756,369 (the '369 patent), entitled "Rapid thermal processing using narrowband infrared source and feedback," describes rapid thermal processing (RTP) of a semiconductor wafer performed by scanning a laser beam across a silicon dioxide film in contact with a surface of the wafer. The silicon dioxide film absorbs the energy from the laser beam and converts the energy to heat. The heat, in turn, is transferred to the wafer. Temperature feedback can be obtained to increase control and uniformity of temperatures across the wafer. However, a shortcoming of this technique is that the temperature of the entire wafer rises to the dopant activation temperature (typically from 800° C. to 1100° C.). Also, a silicon dioxide film is required to be deposited on the backside of the wafer. In addition, a continuous wave $CO_2$ laser is used, which does not allow for sufficient cooling of the wafer region being processed for many applications.

U.S. Pat. No. 5,897,381, (the '381 patent) entitled "Method of forming a layer and semiconductor substrate," discloses and claims a method of forming a layer on a semiconductor substrate having a front side and a backside, the method comprising the steps of placing a film of material in contact with the backside of the substrate, then directing a beam of narrowband energy onto the film such that the film absorbs the energy and transfers heat to the substrate, then controlling temperatures across the backside of the substrate, and then finally performing an additive process on the front side of the substrate. However, like the '369 patent, the '381 patent has the shortcoming that the entire wafer rises to the dopant activation temperature (typically from 800° to 1100° C.) when heated. Also, a silicon dioxide film needs to be deposited at the back of the wafer, and a continuous wave $CO_2$ laser is used, which does not allow for sufficient cooling of the wafer region being processed for many applications.

U.S. Pat. No. 5,908,307, entitled "Fabrication method for reduced-dimension FET devices," describes pre-amorphization of a surface layer of crystalline silicon to an ultra-shallow (e.g., less than 100 nm) depth which provides a solution to fabrication problems including (1) high thermal conduction in crystalline silicon and (2) shadowing and diffraction-interference effects by an already fabricated gate of a field-effect transistor on incident laser radiation. Such problems, in the past, have prevented prior-art projection gas immersion laser doping from being effectively employed in the fabrication of integrated circuits comprising MOS field-effect transistors employing 100 nm and shallower junction technology. However, a shortcoming of this technique is that the polygate may not be able to stand the high laser fluence without appreciable deformation. Another shortcoming is that undesired silicon melting underneath the trench isolation is likely to occur.

U.S. Pat. No. 4,617,066, entitled, "Process of making semiconductors having shallow, hyperabrupt doped regions by implantation and two step annealing," describes a method for producing hyperabrupt P+ or N+ regions in a near-surface layer of a substantially defect free crystal, using solid phase epitaxy and transient annealing. The process for producing a hyperabrupt retrograde distribution of the dopant species begins with amorphizing the near-surface layer of a base crystal, and then implanting a steep retrograde distribution of the desired species into the amorphized layer, so that the retrograde distribution lies entirely within the amorphized layer, thereby avoiding channeling effects during implantation. The substantially defect-free structure of the base crystal is restored by annealing the implanted base crystal at a temperature sufficiently high to induce solid phase epitaxial regrowth on the underlying nonamorphized crystal, but at a temperature sufficiently low to avoid significant diffusion of the implanted species. The implanted species is subsequently activated by a rapid thermal annealing process, at a temperature sufficiently high to activate the implanted species, but for a very short time so that long-range diffusion does not occur. In a preferred embodiment, the implanted species is boron, $BF_2+$, phosphorus, or arsenic in the top 0.20 micrometers of a substantially defect-free silicon base crystal, which may be in a bulk form or epitaxially deposited on an insulator. However, a shortcoming of this technique is that conventional rapid thermal annealing is used, which typically results in diffusion (even over short ranges), which can significantly impact device performance.

U.S. Pat. No. 4,151,008, entitled, "Method involving pulsed light processing of semiconductor devices," discloses a method in which a pulsed laser or flash lamp produces a short duration pulse of light for thermal processing of selected regions of a semiconductor device. The light pulse is directed towards the semiconductor device and irradiates selected surface regions of the device to be processed. Energy deposited by the light pulse momentarily elevates the temperature of the selected regions above threshold processing temperatures for rapid, effective annealing, sintering or other thermal processing. The characteristics of the light pulse are such that only those surface vicinity regions to be processed are elevated to a high temperature and the remaining mass of the semiconductor device is not subjected to unnecessary or undesirable high temperature exposure. However, a shortcoming of this technique is that the dopant concentration cannot go beyond solid solubility limit.

U.S. Pat. No. 4,456,490, entitled, "Laser annealing of MIS devices by back surface laser treatment," discloses a process for fabricating a metal-insulator-semiconductor integrated circuit, including the step of passing a laser beam through a silicon wafer from the back surface to effect localized heating of an insulating layer, upon which is formed metallic circuit paths. However, a shortcoming of this technique is that the absorbing layer needs to remain as part of the structure of the IC, which is not always desirable.

SUMMARY OF THE INVENTION

The present invention relates to semiconductor processing, and more particularly relates to processes of forming an activated doped region in a semiconductor.

A first aspect of the invention is a process for fabricating an activated region in a semiconductor substrate having an upper surface. The process comprises the steps of first, forming an amorphous region the semiconductor substrate near the upper surface, then doping the amorphous region thereby forming a doped amorphous region, then forming a strippable conformal layer atop the upper surface of the substrate, and then performing at least one of front-side irradiation and backside irradiation,. thereby providing sufficient heat to the doped amorphous region to effectuate activation of the doped amorphous region.

A second aspect of the invention is a process for fabricating an activated region in a semiconductor substrate having an upper surface. The process comprises the steps of first, forming a deep dopant region below the upper surface of the substrate. The next step is forming a doped region within or adjacent the deep dopant region. This results in the formation of an amorphous-crystalline interface between the doped region and the deep dopant region. The next step is doping the amorphous region thereby forming a doped amorphous region. The next step is forming a strippable conformal layer atop the upper surface of the substrate. The final step is performing at least one of front-side irradiation and backside irradiation, thereby providing sufficient heat to the deep dopant region to effectuate activation of said doped region.

A third aspect of the invention is either one of the processes as described above, wherein the dopant implant step includes performing a boron dopant implant with a dose of $1 \times 10^{16}$ cm$^{-2}$, and then performing one of front-side and backside irradiation until the doped amorphous region has a sheet resistance of 73 Ω/sq or less, and a junction depth of 50 nanometers or less.

DETAILED DESCRIPTION OF THE INVENTION

The present invention relates to semiconductor processing, and more particularly relates to processes of forming an activated doped region in a semiconductor.

The present invention is demonstrated with respect to forming a junction, one of the simplest semiconductor device structures. The process involves laser thermal processing (LTP) of a silicon (Si) substrate. In the embodiments set forth below, isolation elements on the upper surface of the Si substrate are described and shown in the Figures for ease of illustration, but are not necessary for practicing the invention. It will be understood by one skilled in the art that the processes described herein are applicable to, and are generally intended for use in connection with the simultaneous manufacture of large numbers of integrated circuits formed on a semiconductor wafer substrate. Many of the processing steps described below are also described in detail in U.S. patent application Ser. No. 09/286,492, filed on Apr. 5, 1999, now U.S. Pat. No. 6,326,219, by the applicant, which patent application is incorporated herein by reference. Also, the substrate referred to herein is preferably Si, though other known semiconductor substrates could be used. The temperatures cited below refer to Si substrates.

First Embodiment

Figure 1A:
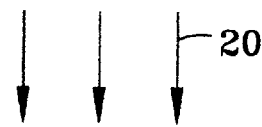
FIG. 1A is a cross-sectional schematic diagram, of a semiconductor substrate and select oxide layer, along with the implanting beam used to form the amorphized layer in the process of forming a junction, according to the first and third embodiments of the invention.

With reference now to FIG. 1A, a semiconductor substrate 10 having an upper surface 11 (also referred to herein as the "front-side") and a lower surface 12 (also referred to herein as the "backside") is provided. Substrate 10 can be a semiconductor material such as Si, preferably in the form of a single crystal substrate of the kind used in the art of semiconductor device manufacturing. As described above, an optional step (which is considered the zeroeth step in the present embodiments and in the other embodiments set forth below) is forming an oxide layer 14 on selected regions on upper surface 11 of substrate 10. This oxide layer 14 is also referred to as the "select oxide layer". Oxide layer 14 may be formed using, for example, a resist layer as a mask to block of a region on upper surface 11, and then performing thermal oxidation, remote plasma oxidation, or chemical vapor deposition (CVD). In a typical case where substrate 10 is composed of Si, oxide layer 14 serves to electrically isolate other integrated structures formed at a later time in the process of building a semiconductor device.

The first step in the process according to the first embodiment is then forming, a region of amorphous Si in the otherwise crystalline Si substrate which has a weak dopant concentration (e.g., $10^{15}$–$10^{16}$ ions/cm$^3$. This is achieved by performing a first ion implant, indicated by arrows 20, which implants Si or Ge into a given region 24 of substrate 10 through upper surface 11 to a target depth ranging from a few angstroms to less than 1000 angstroms. This implantation process disorders the substrate crystal structure in region 24, to the point of making this implanted region amorphous. Amorphous region 24 defines the boundary for the abrupt junction. The implanted species can be Si, Ge, Ar, As, P, Xe, Sb, and In. The implant energy is preferably 2 keV to 100 keV and the implant dose is preferably in the range from $1\times10^{13}$ atoms/cm$^2$ to $1\times10^{16}$ atoms/cm$^2$. Implantation of amorphizing dopants can be performed with known apparatus, such as the 9500 XR ION IMPLANTER™, commercially available from Applied Materials,. Inc., San Jose, Calif.

Figure 1B:
FIG. 1B is a cross-sectional schematic diagram of the device of FIG. 1A, showing the dopant implant step associated with the first and second embodiments of the present invention, and which also applies to the third and fourth embodiments of the present invention, with the exception of the formation of the amorphous region.

With reference now to FIG. 1B, the second step in the process is performing a second ion implant, indicated by arrows 30, using p-type dopant ions (e.g., boron, aluminum, gallium; beryllium, magnesium, or zinc) or n-type dopant ions (e.g., phosphorous, arsenic, antimony, bismuth, selenium, and tellurium) from an ion implanter. The ions are accelerated to a given energy level (e.g., 200 eV to 40 KeV) and implanted in amorphized region 24 (see FIG. 1A) through upper surface 11 to a given dose (e.g., about $1\times10^{14}$ atoms/cm$^2$ to $1\times10^{16}$ atoms/cm$^2$, thereby forming doped, amorphous region 34. Amorphous region 34 has, in practice, a concentration of dopant that is graded with depth into substrate 10 from upper surface 11. The first and second steps of the present embodiment can be interchanged to achieve the same effect. The second (amorphization) step may be omitted completely if the dopant implant carried out to introduce dopants into substrate 10 to be activated also creates an amorphous region.

Figure 1C:
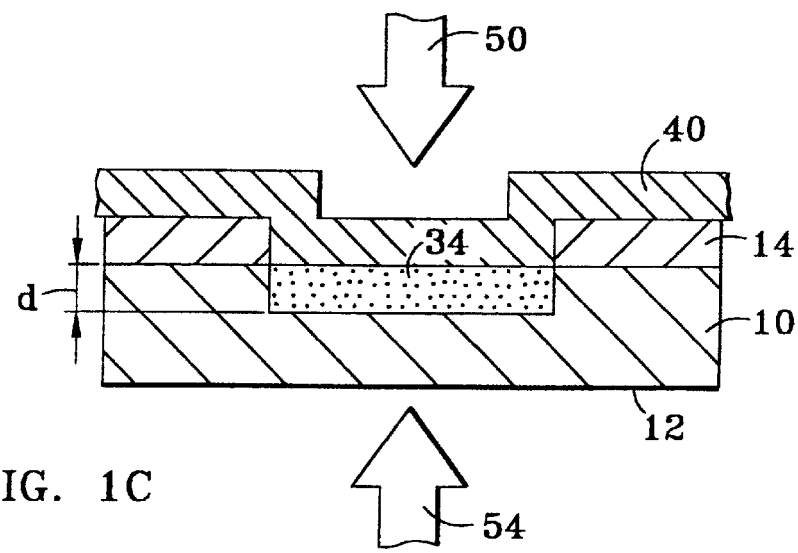
FIG. 1C is a cross-sectional schematic diagram of the device of FIG. 1B, showing the conformal layer and front-side and/or backside irradiation to activate the dopant region formed in the structure shown in FIG. 1B.

With reference now to FIG 1C, the third step is depositing a strippable conformal layer 40 over upper surface 11, including oxide layer 14. Conformal layer 40 needs to be capable of withstanding high temperatures, i.e., temperatures in excess of the Si melting temperature of 1410° C. The material making up conformal layer 40 must also be easily removable without impacting the layers or regions below. The role of conformal layer 40 is to maintain the physical structure of the device during processing. An exemplary material for conformal layer 40 is tantalum nitride (TaN), deposited to a thickness of between 500 and 1000 angstroms via sputtering or by CVD. Other preferred materials for conformal layer 40 include titanium (Ti), titanium nitride (TIN), tantalum (Ta), tungsten nitride (WN), oxide, nitride, or combination of these. An oxide or nitride layer may need to be deposited as part of the conformal layer to prevent contamination of substrate 10 by the metallic conformal layer (i.e., between metal and semiconductor), or to adjust the reflectivity of the conformal layer.

With continuing reference to FIG 1C, a first alternative for the third step of the present embodiment is to perform laser annealing by irradiating the conformal layer through upper surface 11 of substrate 10 with a beam of radiation ("radiation beam") 50. This process is referred to herein as "front side irradiation". Radiation beam 50 is preferably from a laser emanating pulsed light having a wavelength of between 0.1 and 0.6 microns, a temporal pulse width of less than 1 ms, and an irradiance between 0.1 to 1000 J/cm$^2$ per pulse. Conformal layer 40 may be made of a transparent material, such as silicon dioxide, so as to maximize the laser energy absorbed by doped amorphous region 34. In this case, conformal layer 40 serves mainly to keep the junction structure together, while also preferably serving as an anti-reflection coating. The energy absorbed in-doped amorphous region 34 is designed to be sufficient to heat the region to a temperature in the range of 800° C. to 1100°C. This temperature range is sufficient to activate doped amorphous region 34 without melting it. Alternatively, the temperature of doped amorphous region 34 may be made high enough (e.g., in excess of 1100° C., but preferably less than 1410° C., the melting temperature of substrate 10) to melt the doped amorphous region to achieve activation upon recrystallization. Doped amorphous region 34 has a junction depth d, as shown in FIG. 1C, which in the present invention can be as small as 50 nanometers, as can be seen from the various dopant profiles of FIG. 2.

Conformal layer 40 may also be made of an opaque material so as to couple energy from radiation beam 50 into doped amorphous region 34. In this case, radiation beam 50 preferably has a wavelength of between 0.1 and 20 microns, a temporal pulse width of less than 1 ms, and an irradiance between 0.1 to 1000 J/cm² per pulse. The energy from radiation beam 50 is designed so that it is absorbed in conformal layer 50 so that doped amorphous region 34 is heated sufficiently to a temperature in the range of 800° C. to 1100° C., i.e., sufficient to activate the amorphous region without melting it. Also, as discussed above, alternatively, the temperature of conformal layer 40 may be made high enough, (e.g., in excess of 1100° C.) to melt doped amorphous region 34 to achieve activation upon recrystallization.

In a second alternative for the third step of the present embodiment, the same effect may be achieved by irradiating lower surface 12 of substrate 10 with a radiation beam 54. This process is referred to herein as "backside irradiation". In this case, lower surface 12 of substrate 10 should be polished to avoid light loss due to surface scattering. Radiation beam 54 preferably has a wavelength between 1 to 20 microns, a temporal pulse length of less than 1 ms, and an irradiance between 0.1 to 1000 J/cm². Radiation beam 54 passes through substrate 10 without significant attenuation, but is absorbed by conformal layer 40. Heat from heated conformal layer 40 then diffuses into substrate 10 and heats doped amorphous region 34 to a temperature between 800° C. and 1100° C., which is sufficient to activate the region without melting the region. Alternatively, the temperature of doped amorphous region 34 may be made high enough (e.g., in excess of 1100° C.) through backside irradiation to melt the region to achieve activation upon recrystallization. The preferred conformal layer is made out of opaque materials, which absorb light at wavelength between 1 to 20 microns, since the layer absorbs radiation first passing through substrate 10 from lower surface 12. Also, in this case, conformal layer 40 may comprise a material that reflects heat, such as aluminum. Thus, conformal layer 40 acts to direct any radiation that passes through doped amorphous region 34 back into the doped amorphous region, further heating this region.

In a third alternative for the fourth step of the present embodiment, both back surface and front surface irradiation using both radiation beams 50 and 54 can be used to achieve activation of doped amorphous region 34. In this case, radiation beam 50 has an irradiance sufficient to heat amorphous region 34 to a temperature Up to <1100° C. In combination therewith, lower surface 12 of substrate 10 is irradiated (backside irradiation) with radiation beam 54 having a wavelength between 1 to 20 microns, a temporal pulse length of less than 1 ms, and an irradiance between 0.1 to 1000 J/cm². Radiation beam 54 passes through substrate 10 from lower surface 12 without significant attenuation, and is absorbed by conformal layer 40. The irradiance of radiation beam 54 is designed to further heat conformal layer 40 to a temperature between 800° C. and 1100° C., which is sufficient to activate doped amorphous region 34. Also, in this alternative embodiment, the temperature of doped amorphous region 34 may be made high enough (e.g., in excess of 1100° C.) to melt the region to achieve activation upon recrystallization by dopant trapping. If conformal layer 40 is made of opaque material, radiation with a wavelength in the range of 0.1 to 20 microns should be used. If the conformal layer is made out of transparent material, a radiation with a wavelength in the range of 0.1 to 0.6 micron should be used.

Figure 2:
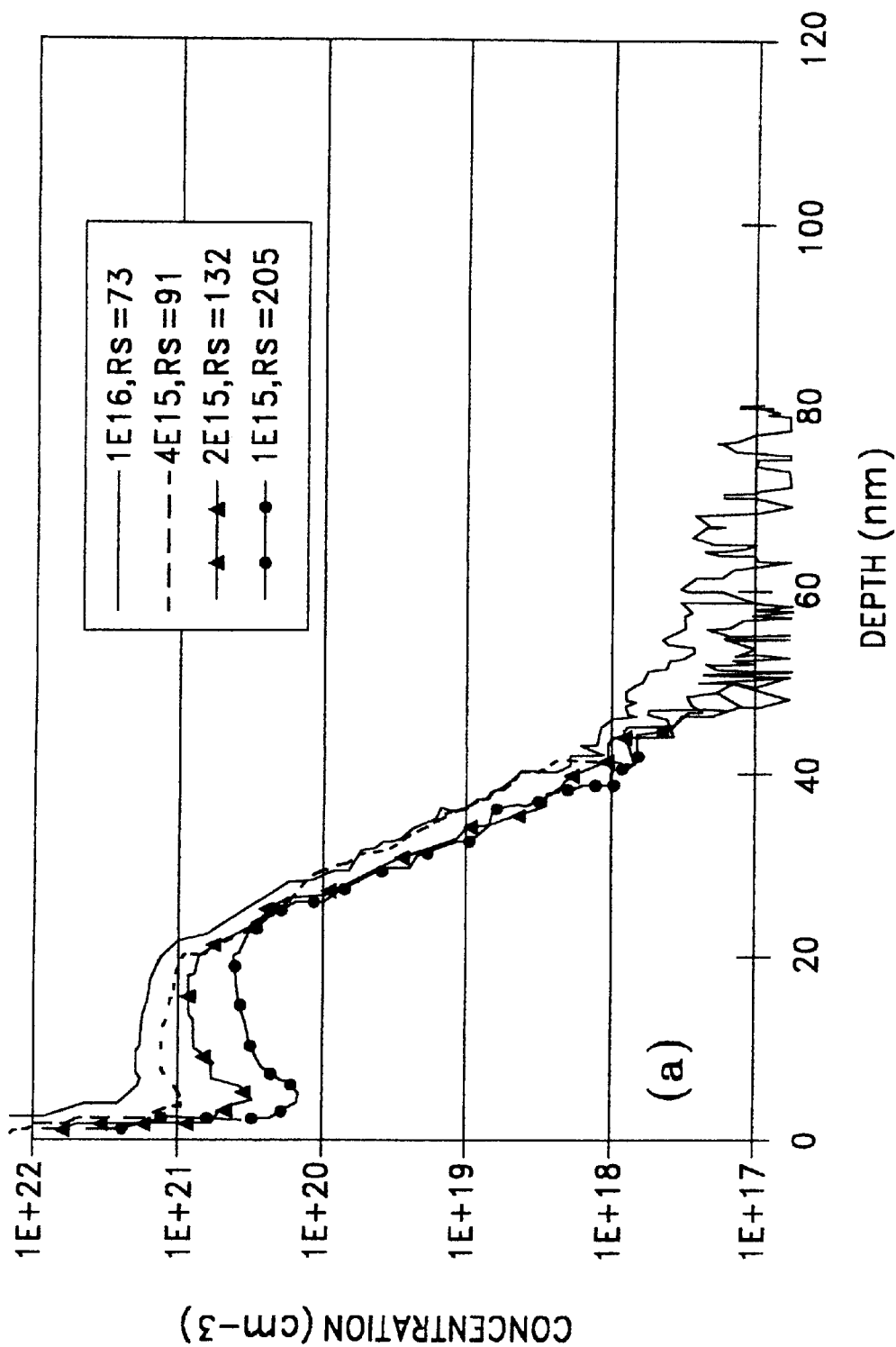
FIG. 2 is a SIMS profile plot of boron in silicon at different implant doses and the associated sheet resistance values for a junction device formed using the first embodiment of the process according to the present invention, which is also representative of the boron profiles formed using the second through fourth embodiments of the present invention.

After irradiation is performed using one of the irradiation alternatives discussed above, in the fifth step, conformal layer 40 is stripped away, using for example concentrated hydrofluoric acid. This leaves a doped amorphous region 34 that is activated, wherein the dopant profile is very shallow (on the order of 50 nm), has a sharply defined boundary, and has a very low sheet resistance, as indicated in. FIG. 2. The dopant concentration in the laser annealed junction of the present invention is much higher and relatively scales with implant doses, while in junctions formed by RTA, the dopant concentration saturates at about $3 \times 10^{20}$ cm$^{-3}$. For a boron implant dose of $1 \times 10^{16}$ cm$^{-2}$, the sheet resistance is about 73 Ω/sq. It is believed this represents the lowest sheet resistance reported for junctions shallower than 50 nm. It also indicates that the activated dopant concentration is above $10^{21}$ cm$^{-3}$, which is higher than the solid solubility limit.

Second Embodiment

Figure 3:
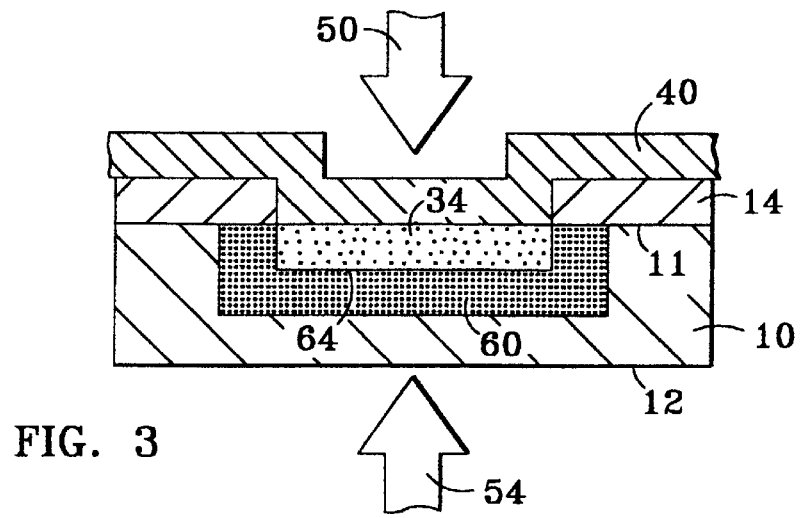
FIG. 3 is a cross-sectional schematic diagram of the junction device formed using the second embodiment of the present invention.

With reference now to FIG. 3, a second embodiment of the process of the present invention is now described. Where the same components and structures from the first embodiment are used, the same reference numbers are also used. Like the first embodiment, the present embodiment begins with the zeroeth step of providing a substrate 10 with a select oxide layer 14 formed on upper surface 11, as described above.

Accordingly, the first step of the present embodiment is forming in substrate 10 a deep, activated doped region 60 ("deep dopant region"). Region 60 may be formed, for example, by ion implanting dopant ions at a dose range from $10^{12}$–$10^{14}$ atoms/cm² within substrate 10 at a depth of approximately 0.1 μm to 0.5 μm, and then performing a rapid thermal anneal (RTA) of the substrate to activate the region. Alternatively, the dopants may be deposited at or near upper surface 11 and then diffused into substrate 10 to the desired depth. The relatively high dopant concentration of region 60 causes increased absorption of light in the 0.6 to 20 μm wavelength range within the region. Accordingly, light having a wavelength between 0.6 to 20 microns will pass through crystalline substrate 10 (which has a doping concentration less than $10^{16}$ ions/cm³ and hence a lower absorption), but will be absorbed in region 60.

The second step of the process of the present embodiment is then forming an amorphous region 24 near upper surface 11 of substrate 10, as described above in connection with the first step of the first embodiment. Amorphous region 24 is preferably formed within deep dopant region 60. Amorphous region 24 may also be formed adjacent deep dopant region 60 between region 60 and upper surface 11 of substrate 10.

The third step is then doping amorphous region 24 to form a doped amorphized region 34, as described above in connection with the second step of the first embodiment.

The fourth step is forming a strippable conformal layer 40 atop the structure, as described above in connection with the third step of the first embodiment.

A first alternative for a fifth step of the present embodiment is performing front-side irradiation with radiation beam 50, as described above in connection with the third step of the first embodiment. Radiation beam 50 is preferably pulsed laser light of a wavelength of 0.1 to 20 microns, with an irradiance of 0.1 to 1000 J/cm², and having a temporal pulse length shorter than 1 ms. Conformal layer 40 can either be transparent or opaque, as described above.

For a transparent conformal layer 40, radiation beam 50 preferably has a wavelength range from 0.6 to 2 μm. Energy from radiation beam 50 is transferred from conformal layer 40 to substrate 10 and is absorbed by deep dopant region 60. A temperature gradient forms at an interface 64 between deep dopant region 60 and the doped amorphous region 34. When a sufficiently high temperature is reached at interface 64 (e.g., 1100° C., the melting temperature of amorphous silicon), doped amorphous region 34 undergoes explosive recrystallization, in which a moving melt front propagates toward upper surface 11 of substrate 10. The explosive recrystallization occurs when the molten Si starts to solidify into crystalline Si from the primary melt at interface 64. The latent heat released by this solidification melts a thin layer of the overlying doped amorphous region immediately adjacent interface 64. Latent heat is again released during crystallization of this secondary melt and thus a thin liquid Si layer propagates from the original liquid-solid interface 64 to upper surface 11 of substrate 10. This process is quenched at conformal layer 40, since the melting temperature of the conformal layer is higher than doped, amorphous region 34 (or amorphous Si generally).

Alternatively, front-side irradiation is performed as above, but with an amount of irradiance is designed to provide energy to deep doped region 60 so that deep doped region 60 heats doped amorphous region 34 to a temperature between 800° C. to 1000° C., which is sufficient to activate the doped amorphous region without melting A second alternative for the fifth step of the present embodiment involves irradiating lower surface 12 of substrate 10 (backside irradiation) with radiation beam 54 having a wavelength from 1 to 20 microns, an irradiance of 0.1 to 1000 J/cm$^2$ and a temporal pulse length shorter than 1 ms. In this case, lower surface 12 should be polished to avoid light loss due to surface scattering. Radiation beam 54 travels through substrate 10 and is absorbed in deep dopant region 60, heating interface 64 between the deep dopant region and doped amorphous region 34. This forms a temperature gradient, which causes explosive re-crystallization of doped amorphous layer 34, once to the temperature at interface 64 gets higher than 1100° C. The recrystallization interface propagates toward upper surface 11 of substrate 10. Alternatively, deep dopant region 60 is provided with heat from the backside irradiation designed to heat doped amorphous region 34 to a temperature that is sufficient to activate the doped amorphous region without melting the region, as described above. Conformal layer 40 can be made out of reflecting, transparent, or opaque materials.

A third alternative for the fifth step of the present embodiment is using both front side and backside irradiation via radiation beams 50 and 54, respectively, to form the thermal gradient at interface 64, so as to initiate explosive recrystallization, which activates doped amorphous region 34, as described above. Alternatively, sufficient heat can be added to doped amorphous region 34 via front side irradiation such that, when combined with the heat from the explosive recrystallization, the doped amorphous region melts and recrystallizes to achieve activation. Another alternative is to heat deep doped region 60 with radiation beam 54 and then further heat doped amorphous region 34 with radiation beam 50 to a temperature that is sufficient to activate the doped amorphous region without melting the region. Conformal layer 40 may be made out of transparent or opaque materials. For front-side irradiation, with a transparent conformal layer 40, the wavelength of radiation beam 50 is preferably in the range from 0.6 to 20 micron. For front-side irradiation with an opaque conformal layer 40, the wavelength of radiation beam 50 is preferably in the range from 0.1 to 20 microns. For backside irradiation, the wavelength of radiation beam 54 is preferably in the range from 1 to 20 microns.

After irradiation is performed using one of the irradiation alternatives discussed above, in the sixth step, conformal layer 40 is stripped away, as discussed above in connection with the fifth step of the first embodiment, thereby leaving a doped activated layer 34 that is very shallow, has a sharply defined boundary, and a very low sheet resistance, as discussed above in connection with the first embodiment, and as shown in FIG. 2.

Third Embodiment

Figure 4:
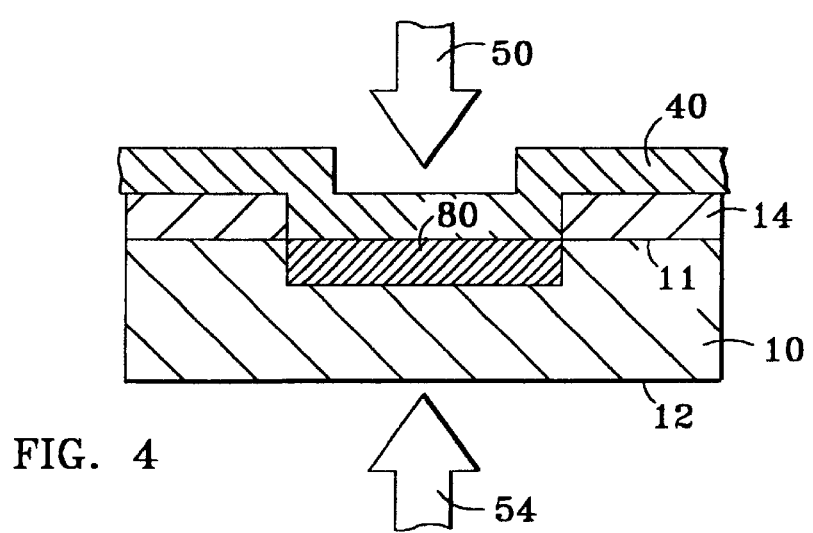
FIG. 4 is a cross-sectional schematic diagram of the junction device formed using the third embodiment of the present invention.

With reference now to FIG. 4, a third embodiment of the process of the present invention is now described. Like the first embodiment, the present embodiment begins with the zeroeth step of providing a substrate 10 with a select oxide layer 14 formed on upper surface 11, as described above.

The first step of the third embodiment is forming a dopant region 80 by ion implanting dopant ions at a dose between $10^{13}$–$10^{16}$ atoms/cm$^2$ within substrate 10 near upper surface 11, to a depth of approximately 5 to 1000 angstroms. Unlike the first embodiment, dopant region 80 is not amorphized.

The second step of the present embodiment is optional and involves forming a strippable conformal layer 40 atop upper surface 11, to facilitate heat transfer to substrate 10 and to dopant region 80, as described above in connection with the third step of the first embodiment.

A first alternative for a third step of the present embodiment involves performing front side irradiation with radiation beam 50 having a wavelength of between 0.1 and 20 microns, a temporal pulse width of less than 1 ms, and an irradiance between 0.1 to 1000 J/cm$^2$ per pulse.

If a conformal layer 40 is present and made of a transparent material, radiation beam 50 is absorbed by doped region 80. The energy from this absorption is sufficient to heat doped region 80 to a temperature between 800° C. and 1410° C., which is sufficient to activate the doped region without melting it or the crystalline substrate 10, the latter having a melting temperature of about 1410° C. Also, in an alternative embodiment, the temperature of doped region 80 may be made high enough to melt the doped region to achieve activation upon recrystallization, as described in the above embodiments.

If conformal layer 40 is made of an opaque material, then radiation beam 50 is absorbed by conformal layer 40. Heat from this absorption is diffused to doped region 80. This heat is designed to be sufficient to heat doped region 80 to a temperature between 800° C. and 1410° C., which is sufficient to activate the doped region without melting it. In an alternative embodiment, the temperature of doped region 80 may be made high enough to melt the doped region to achieve activation upon recrystallization.

In a second alternative for the third step of the present embodiment, the same effect may be achieved by irradiating substrate 10 with backside irradiation via radiation beam 54. In this case, lower surface 12 should be polished to avoid light loss due to surface scattering. As in the embodiments described above, radiation beam 54 preferably has a wavelength between 1 to 20 microns, a temporal pulse length of less than 1 ms, and an irradiance between 0.1 and 1000 J/cm$^2$. Radiation beam 54 travels through lower surface 12 of substrate 10, and is absorbed in dopant region 80. Radiation beam 54 is absorbed by doped region 80 and heats this region to a temperature of 800° C. and 1100° C., which is sufficient to activate the region without melting the region. Also, in an alternative embodiment, the temperature of doped region 80 may be made high enough to briefly melt the region to achieve activation upon recrystallization. Also, in this case, conformal layer 40 may comprise a material that reflects heat, such as aluminum. Thus, conformal layer 40 acts to direct any light that passes through doped region 80 back into the doped region, further heating the doped region. Also, as discussed above in connection with the previous embodiments, conformal layer 40 can also be made out of transparent or opaque materials.

In another alternative to the third step of the present embodiment, both backside and front-side irradiation is performed with radiation beams 50 and 54, respectively, to achieve activation of doped region 80. In this case, radiation beam 50 preferably has an irradiance sufficient to heat doped region 80 to a temperature up to 1000° C. The wavelength of radiation beam 50 should be 0.1 to 20 microns if a conformal layer 40 is present. In combination therewith, radiation beam 54 irradiates substrate 10 through lower surface 12, with radiation beam 54 having a wavelength of between 1 to 20 microns, a temporal pulse length of less than 1 ms, and an irradiance between 0.1 and 1000 J/cm². Radiation beam 54 is designed to heat doped region 80 to a temperature, which is sufficient to activate the region without melting the region. Also, in this alternative embodiment, the temperature of doped region 80 may be made high enough to briefly melt the region to achieve activation upon recrystallization. Also, in this case, conformal layer 40, if present, may comprise a material that reflects heat, such as aluminum. Thus, conformal layer 40 in this instance acts to direct radiation that passes through doped region 80 back into the doped region, further heating the doped region. On the other hand, the conformal layer can also be made out of either transparent or opaque materials, and function as a member for holding the structure together, or as an absorbing member, respectively.

After irradiation is performed using one of the irradiation alternatives discussed above, the conformal layer is stripped away, leaving a doped activated layer that is very shallow with sharp definition, and a very low sheet resistance, as discussed above in connection with the first embodiment, and as shown in FIG. 2.

Fourth Embodiment

Figure 5:
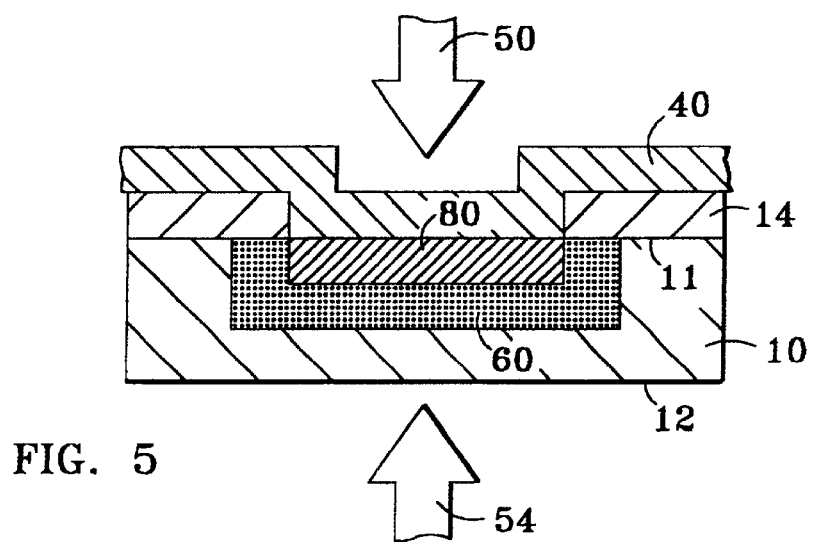
FIG. 5 is a cross-sectional schematic diagram of the junction device formed using toe fourth embodiment of the present invention.

With reference now to FIG. 5, a fourth embodiment of the process of the present invention is now described. Like the first embodiment, the present embodiment begins with the zeroeth step of providing a substrate 10 with a select oxide layer 14 formed on upper surface 11, as described above.

The first step of the present embodiment is forming a deep dopant region 60, as described above in connection with the first step of the second embodiment.

The second step of the present embodiment is forming a dopant region 80 within substrate 10 near upper surface 11, as described above in connection with the first step of the third embodiment.

The third step of the present embodiment is forming a strippable conformal layer 40 atop upper surface 11 and covering select oxide layer 14, as described above in connection with the third step of the first embodiment.

The fourth step of the present invention includes, as a first alternative, performing front side irradiation with radiation beam 50 as described above in connection with the fifth step (first alternative) of the third embodiment.

A second alternative to the fourth step of the present embodiment is performing backside irradiation with radiation beam 54, as described above as the second alternative to the fifth step of the third embodiment, described above.

A third alternative to the fourth step of the process is performing both front side and backside irradiation using radiation beams 50 and 54, respectively, as described above in the second alternative to the fifth step of the third embodiment, described above.

After irradiation using one of the irradiation alternatives discussed above, conformal layer 40 is stripped away, leaving a doped activated layer that is very shallow with sharp definition, and a very low sheet resistance (see FIG. 2), as described above in connection with the first embodiment.

While the present invention has been described in connection with preferred embodiments, it will be understood that it is not so limited. In addition, it will be understood that the particular radiation beam irradiance values and other parameters associated with practicing the present invention may best be determined empirically rather than analytically, as is common in the art of semiconductor processing. Accordingly, the present invention is intended to cover all alternatives, modifications and equivalents as may be included within the spirit and scope of the invention as defined in the appended claims.

What is claimed is:

1. A process comprising:
   a) in a semiconductor substrate having an upper surface, a frontside and a backside, and being substantially transparent to a first radiation beam having a first wavelength, forming an amorphous region in the semiconductor substrate near the upper surface;
   b) doping the amorphous region to form a doped amorphous region;
   c) forming a strippable conformal layer atop the upper surface of the substrate, the conformal layer capable of absorbing energy from the first radiation beam;
   d) heating the conformal layer by irradiating the backside of the substrate with the first radiation beam having the first wavelength; and
   e) heating the doped amorphous region with heat from the conformal layer to activate the doped amorphous region.

2. A process according to claim 1, wherein the heating of the doped amorphous region is insufficient to melt the doped amorphous region.

3. A process according to claim 1, wherein the heating of the doped amorphous region is sufficient to melt the doped amorphous region but insufficient to melt the substrate.

4. A process according to claim 1, wherein the first wavelength is between 1 and 20 microns.

5. A process according to claim 1, further including heating the doped amorphous region from the front side with a second radiation beam having a second wavelength capable of being transmitted by the conformal layer and absorbed by the doped amorphous region.

6. A process according to claim 1, further including heating the conformal layer from the front side with a second radiation beam having the first wavelength so as to additionally heat the conformal layer.

7. A process according to claim 1, wherein the conformal layer comprises at least one of tantalum nitride, titanium, titanium nitride, tantalum, tungsten nitride, oxide, and nitride.

8. A process according to claim 1, further including stripping the conformal layer after activating the doped region.

9. A process according to claim 5, wherein, said front-side irradiation beam comprises pulsed laser light having a wavelength of between 0.1 and 0.6 microns, a temporal pulse width of less than 1 ms, and an irradiance between 0.1 and 1000 J/cm² per pulse.

10. A process according to claim 6, wherein said front-side irradiation includes pulsed laser light having a wavelength of between 0.1 and 2.0 microns, a temporal pulse width of less than 1 ms, an irradiance between 0.1 and 1000 J/cm² per pulse.

11. A process according to claim 1, wherein said first radiation beam includes laser light having a wavelength between 1 to 2 microns, a temporal pulse length of less than 1 ms, and an irradiance between 0.1 and 1000 J/cm².

12. A process according to claim 1, wherein:
i) doping the amorphous region includes performing a boron dopant implant with a dose of $1 \times 10^{16}$ cm$^{-2}$ until the amorphous region has a sheet resistance of 73 Ω/sq or less, and a junction depth of 50 nanometers or less.

* * * * *